United States Patent [19]

Smayling

[11] Patent Number: 5,798,281

[45] Date of Patent: Aug. 25, 1998

[54] METHOD FOR STRESSING OXIDE IN MOS DEVICES DURING FABRICATION USING FIRST AND SECOND OPPOSITE POTENTIALS

[75] Inventor: Michael C. Smayling, Missouri City, Tex.

[73] Assignee: Texas Instruments Incorporated, Dallas, Tex.

[21] Appl. No.: 554,302

[22] Filed: Nov. 8, 1995

[51] Int. Cl.$^6$ .................................................. H01L 21/00
[52] U.S. Cl. .......................... 438/14; 438/12; 438/17; 324/765
[58] Field of Search .......................... 437/170, 40 TFI, 437/171, 172, 40 GS, 41 GS, 40 TFT, 41 TFT, 41 TFI; 438/10, 11, 12, 14, 17, 18; 324/765

[56] References Cited

U.S. PATENT DOCUMENTS

| | | | |
|---|---|---|---|
| 3,775,262 | 11/1973 | Heyerdahl | 204/15 |
| 4,760,032 | 7/1988 | Turner | 438/17 |
| 4,950,977 | 8/1990 | Garcia et al. | 438/17 |
| 5,302,546 | 4/1994 | Gordon et al. | 438/17 |
| 5,308,998 | 5/1994 | Yamazaki et al. | 257/57 |
| 5,391,502 | 2/1995 | Wei | 437/170 |
| 5,543,334 | 8/1996 | Yoshii et al. | 438/17 |

FOREIGN PATENT DOCUMENTS 4117051  2/1994  Japan ........................... 437/40 TFI

OTHER PUBLICATIONS

Joseph King, Wilson Chan and Chenming Hu, "Efficient Gate Oxide Defect Screen for VLSI Reliability", paper presented in *Technical Digest —International Electron Devices* Meeting, San Francisco, California. Dec. 1994.

*Primary Examiner*—Charles L. Bowers, Jr.
*Assistant Examiner*—Lynne A. Gurley
*Attorney, Agent, or Firm*—Robert D. Marshall, Jr.; James C. Kesterson; Richard L. Donaldson

[57] ABSTRACT

A method and apparatus are disclosed for stressing the oxide layer (36) of an MOS integrated circuit during the fabrication process. One aspect of the invention is a method for fabricating an MOS integrated circuit. In accordance with this method, an oxide layer (36) is formed on a semiconductor substrate (34), and a gate layer (38) is formed on top of the oxide layer (36). During fabrication of the MOS integrated circuit, a potential is applied between the gate layer (38) and the semiconductor substrate (34) in order to stress the oxide layer (36). Other aspects of the invention include applying both a forward and reverse potential to stress the oxide layer (36). Also, the oxide stress can be applied at an elevated temperature. Elevated temperature aids in stressing the oxide layer (36).

2 Claims, 1 Drawing Sheet

METHOD FOR STRESSING OXIDE IN MOS DEVICES DURING FABRICATION USING FIRST AND SECOND OPPOSITE POTENTIALS

TECHNICAL FIELD OF THE INVENTION

This invention relates generally to semiconductor processing and more particularly to a method and apparatus for stressing an oxide layer in an MOS integrated circuit during fabrication of the integrated circuit.

BACKGROUND OF THE INVENTION

Flaws in the oxide layer of MOS integrated circuits create one of the most important reliability problems for such integrated circuits. During the oxidation portion of the fabrication process, point defects develop in the oxide that can later lead to device failure. For proper operation of an MOS integrated circuit, the oxide layer must remain as a good insulator. Point defects in the oxide can create shorts between the gate layer and the substrate of an MOS integrated circuit. When the oxide fails in this way, the MOS integrated circuit normally fails and must be replaced.

To improve the reliability of their MOS integrated circuits, semiconductor manufacturers normally "burn-in" these circuits in packaged form. For example, during the burn-in process for dynamic RAMs, packaged integrated circuits operate at 6–7 volts and at temperatures of between 125° C. and 150° C. for 48–96 hours. The burn-in process uses accelerated stress conditions (high voltage and temperature) to cause chips with flaws in the oxide layer to fail, thus preventing them from reaching a customer.

The burn-in process is expensive. It increases the process time for an integrated circuit substantially, requires both expensive equipment and manufacturing floor space, and a number of employees to operate the equipment. Burn-in costs are a significant component of the overall total cost of an MOS integrated circuit.

Burn-in has additional disadvantages. First, burn-in is usually performed with an integrated circuit in packaged form. Increasingly, customers of semiconductor manufacturers would like to purchase integrated circuits in die form. Because burn-in can be even more difficult and expensive to perform with an integrated circuit in die form, it is hard to guarantee reliability of MOS integrated circuits in die form. Also, because of the high number of possible digital states of a complex VLSI device, burn-in may be ineffective with such devices as it is difficult to stress the oxide in the entire device.

SUMMARY OF THE INVENTION

Accordingly, a need has arisen for a method and apparatus that eliminates the need for burn-in of MOS integrated circuits, yet allows stressing of the oxide layer to weed out devices with weak oxide layers in order to assure reliability of devices delivered to customers. The disclosed invention fulfills this need. One aspect of the invention is a method of fabricating an MOS integrated circuit. After an oxide layer has been formed on a semiconductor substrate, a gate layer is formed on top of the oxide layer. Then, during the fabrication process, a potential is applied between the gate layer and the semiconductor substrate to stress the oxide layer.

Other aspects of the invention include applying both a forward and reverse potential to stress the oxide. Also, the oxide stress can be applied at an elevated temperature. Elevated temperature aids in stressing the oxide layer.

The invention has several important technical advantages. Because the oxide layer can be stressed during fabrication, the burn-in process can be shortened or even eliminated. Reducing or eliminating the need for burn-in results in a lower cost fabrication process. Besides reducing the amount of both expensive burn-in equipment and manufacturing plant space required for fabricating MOS devices, the invention reduces the overall fabrication time for an MOS integrated circuit. In addition, because the invention allows stressing of the oxide layer during fabrication, defective dies can be identified at the probe-test phase and discarded before packaging. This saves the cost of packaging for the percentage of integrated circuits that would normally fail at the burn-in stage.

The invention can also be used to improve reliability and yield. Reliability improves because the invention allows stressing the entire oxide layer. Burn-in only stresses the portion of the oxide layer under the gates of MOS transistors. In addition, the invention allows stressing of the oxide with both a forward and reverse polarity, thus revealing more flaws in the oxide. The invention improves yield because oxide flaws will cause failure at the probe test stage of the manufacturing process. At this stage of the process, standard laser repair can be used to substitute redundant circuitry for circuitry that fails. MOS integrated circuits such as dynamic RAMs typically have such redundant circuitry.

Because the oxide can be stressed before an MOS integrated circuit is packaged, the invention allows a semiconductor manufacture to have confidence of the reliability of an MOS integrated circuit die before it is packaged. Thus, the invention allows semiconductor manufacturers to have confidence in the reliability of MOS integrated circuits sold to customers in die form. Similarly, such confidence in reliability allows semiconductor manufacturers to use MOS integrated circuit dies for multi-chip packages. In other words, the invention allows economical exploitation of new packaging options for MOS integrated circuits. One packaging option currently desired by customers is the ability to take several integrated circuit dies and bond them to a ceramic substrate. The invention facilitates this packaging option.

The invention allows the oxide to be stressed in both n-channel and p-channel devices. Also, the invention can easily be automated and incorporated into existing manufacturing processes.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION OF THE INVENTION

Figure 1:
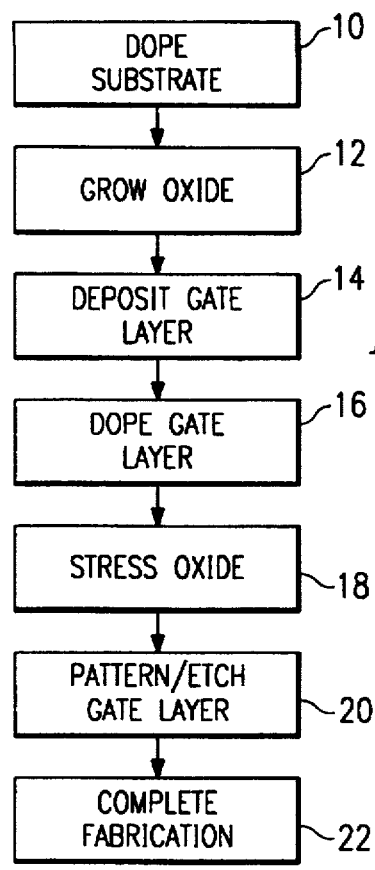
FIG. 1 illustrates a flow diagram for a method of fabricating an MOS integrated circuit in accordance with the invention.
Figure 2:
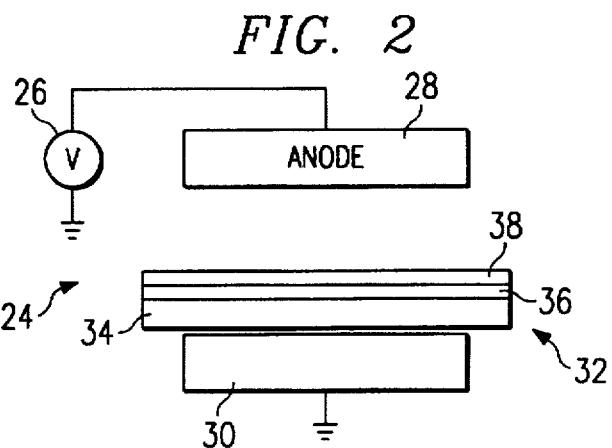
FIG. 2 illustrates a first embodiment of an apparatus for stressing the oxide layer of an MOS integrated circuit in accordance with the invention.
Figure 3:
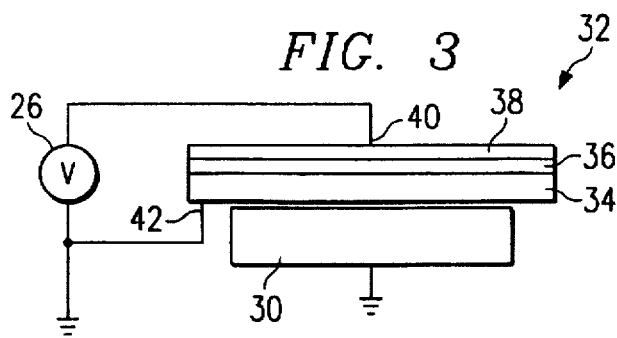
FIG. 3 illustrates a second embodiment of an apparatus for stressing the oxide layer of an MOS integrated circuit in accordance with the invention.

The preferred embodiment of the present invention and its advantages are best understood by referring to FIGS. 1–3 of the drawings, like numerals being used for like and corresponding parts of the various drawings.

FIG. 1 illustrates a flow diagram for a method of fabricating an MOS integrated circuit in accordance with the teachings of the present invention. In step 10, the process begins with the doping of the semiconductor substrate. The substrate may be doped using any known method. Next, in step 12, an oxide layer is grown on top of the semiconductor substrate. Again, any known method may be used to grow the oxide layer. In step 14, a gate layer is deposited on the oxide layer. Any existing method can be used to form the gate layer in step 14. In step 16, the gate layer is doped, again using any known method.

In step 18, the oxide layer is stressed to cause defective areas of the oxide layer to fail in later functional tests conducted during the fabrication process. The oxide can be stressed by creating a sufficiently strong electric field in the oxide layer. Also, raising the temperature of the wafer to a sufficiently high value will aid in stressing the oxide layer. Various types of apparatus can be used to increase the temperature of the wafer and create the electric field in the oxide layer, including those discussed below in connection with FIGS. 2 and 3.

Preferably, for the most commonly used MOS technologies, the electric field created in the oxide layer should be between 7 and 8 megavolts per centimeter. Also, the wafer should be heated to between 125° C. and 150° C., although any temperature greater than 75° C. will tend to aid in stressing the oxide layer. Alternatively, the oxide layer could be stressed simply by creating an electric field in the oxide layer without raising the temperature of the wafer. Larger or smaller electric fields may also be appropriate, depending upon the type of process being used. The stress should preferably be applied for tens of seconds to minutes.

Although the invention can be used to create an electric field of only one polarity in the oxide layer, a reverse polarity stress using a similar magnitude of electric field could also be used. Stressing the oxide twice, once with a first polarity and once with an opposite polarity, helps to ensure that the oxide layer is properly stressed for all types of devices in the MOS integrated circuit. Thus, the invention provides an additional advantage over the currently-used burn-in process as MOS integrated circuits are not usually subjected to a reverse polarity stress during burn-in.

After the oxide has been stressed in step 18, the gate layer can then be patterned and etched in step 20. Depending upon the apparatus used to stress the oxide layer, the step of stressing the oxide could also follow the patterning and etching of the gate layer, although it is believed that the best results will be obtained by stressing the oxide before patterning and etching the gate layer.

Finally, in step 22, fabrication of the integrated circuit is completed. Because the oxide has been stressed during fabrication in step 18, device failures due to oxide defects can be detected during the probe test step. In MOS integrated circuits with redundant circuitry, such as that in dynamic RAMs, an integrated circuit that fails due to oxide defects could be salvaged after probe test using standard laser repair techniques. Redundant circuitry can be substituted for portions of the integrated circuit that fail due to oxide defects.

FIG. 2 illustrates a first apparatus that can be used to stress the oxide layer of an MOS integrated circuit in accordance with the present invention. FIG. 2 illustrates a plasma etcher 24 of the kind used to fabricate MOS integrated circuits. Plasma etcher 24 comprises voltage source 26 and anode 28.

FIG. 2 also illustrates a semiconductor wafer 32 resting on wafer chuck 30. Wafer 32 comprises substrate 34, oxide layer 36, and gate layer 38. In this embodiment, gate layer 38 comprises polysilicon but could also be a metal or other type of conductor. Plasma etcher 24 can be used to perform the step 18 of stressing the oxide in the method discussed in connection with FIG. 1.

In operation, voltage source 26 creates a potential on anode 28. This potential creates an electric field in oxide layer 36. By controlling voltage source 26, plasma etcher 24 may create an electric field in oxide layer 36 sufficient to stress oxide layer 36. For example, plasma etcher could be used to create an electric field having the magnitude of 7–8 megavolts per centimeter as discussed above in connection with FIG. 1. In addition, the polarity on anode 28 can be reversed, creating an electric field of an opposite polarity in oxide layer 36. Also, wafer chuck 30 can be used to raise the temperature of wafer 32 to aid in stressing oxide layer 36.

Although plasma etcher 24 can be used to stress oxide layer 36, designers of plasma etchers normally try to reduce the stress on oxide layer 36 caused by plasma etcher 24. Accordingly, a more desirable method of stressing oxide layer 36 would avoid the use of plasma etcher 24.

FIG. 3 illustrates a second apparatus that can be used to stress the oxide layer 36 of an MOS integrated circuit in accordance with the invention. In this embodiment, a voltage source is connected directly to gate layer 38 and substrate 34 on semiconductor wafer 32. Various methods may be used to connect voltage source 26 to wafer 32. Here, probe 40 and probe 42 are used to connect to gate layer 38 and substrate 34 respectively. Probe 40 makes a front-side contact with gate layer 38 near the front side edge of wafer 32. Multiple probes 40 could also be used. Depending upon the back side condition of wafer 32, a front side coat/back side etch may be used to achieve good electrical contact with substrate 34. In this embodiment, probe 42 is a sharp probe that is able to make good electrical contact with substrate 34. Again, multiple probes 42 could be used to connect to substrate 34.

In operation, voltage source 26 creates a potential between gate layer 38 and substrate 34 with a magnitude sufficient to create an electric field in oxide layer 36 that will stress the oxide. Voltage source 26 can be used to create the electric fields described above in connection with FIG. 1 in the step 18 of stressing the oxide. Thus, voltage source 26 can be used to create an electric field in oxide layer 36 with a magnitude of between 7–8 megavolts per centimeter. Again, the strength of this electric field may vary depending upon the application. Voltage source 26 can also be used to create an electric field of similar magnitude, but of reverse polarity to the field initially created in oxide layer 36. Also, wafer chuck 30 can be used to increase the temperature of wafer 32 so as to increase the stress on oxide layer 36.

The invention can be used with any type of MOS integrated circuit. Examples include microprocessors, dynamic RAMs, static RAMs, microcontrollers, and digital signal processors.

Although the present invention has been described in detail, it should be understood that various changes, substitutions, and alterations can be made hereto without departing from the spirit and scope of the invention as defined by the appended claims.

What is claimed is:

1. A method of fabricating an MOS integrated circuit comprising:

forming an oxide layer on a semiconductor substrate;

forming a gate layer on top of the oxide layer;

following forming said oxide layer and following forming said gate layer applying a first potential during fabrication of the MOS integrated circuit between the gate layer and the semiconductor substrate to stress the oxide layer in order to cause defective oxide layers to fail later functional tests; and following applying said first potential applying a second potential during fabrication of the MOS integrated circuit between the gate layer and the semiconductor substrate to stress the oxide layer, wherein the second potential has a polarity opposite that of the first potential.

2. The method of claim 1, wherein the electric field in the oxide layer created by the first potential is approximately between 7 and 8 megavolts per centimeter.

* * * * *